United States Patent
Aizawa et al.

(10) Patent No.: US 11,842,916 B2
(45) Date of Patent: Dec. 12, 2023

(54) SEMICONDUCTOR PROCESSING ADHESIVE TAPE AND METHOD OF MANUFACTURING SEMICONDUCTOR DEVICE

(71) Applicant: Lintec Corporation, Tokyo (JP)

(72) Inventors: Kazuto Aizawa, Tokyo (JP); Jun Maeda, Tokyo (JP)

(73) Assignee: Lintec Corporation, Tokyo (JP)

( * ) Notice: Subject to any disclaimer, the term of this patent is extended or adjusted under 35 U.S.C. 154(b) by 520 days.

(21) Appl. No.: 17/254,905

(22) PCT Filed: Jun. 4, 2019

(86) PCT No.: PCT/JP2019/022162
§ 371 (c)(1),
(2) Date: Dec. 22, 2020

(87) PCT Pub. No.: WO2020/003919
PCT Pub. Date: Jan. 2, 2020

(65) Prior Publication Data
US 2021/0265193 A1    Aug. 26, 2021

(30) Foreign Application Priority Data
Jun. 26, 2018 (JP) .................. 2018-121127

(51) Int. Cl.
*H01L 21/683*    (2006.01)
*C09J 7/29*    (2018.01)
(Continued)

(52) U.S. Cl.
CPC .......... *H01L 21/6836* (2013.01); *C09J 7/241* (2018.01); *C09J 7/255* (2018.01); *C09J 7/29* (2018.01);
(Continued)

(58) Field of Classification Search
CPC ................. H01L 21/6836; H01L 21/78; H01L 2221/68327; H01L 2221/68381;
(Continued)

(56) References Cited

U.S. PATENT DOCUMENTS 6,303,219 B1 * 10/2001 Sawamura ........ H01L 23/49816
428/343
7,351,645 B2    4/2008 Ohashi et al.
(Continued)

FOREIGN PATENT DOCUMENTS

JP    2003129011 A    5/2003
JP    2005343997 A    12/2005
(Continued)

OTHER PUBLICATIONS

English Abstract for JP2003129011 A, May 8, 2003.
(Continued)

*Primary Examiner* — J. E. Schoenholtz
(74) *Attorney, Agent, or Firm* — CAHN & SAMUELS, LLP

(57) ABSTRACT

A semiconductor processing adhesive tape that includes a substrate, a buffer layer which is provided on at least one side of the substrate, and an adhesive layer which is provided on the other side of the substrate, wherein the buffer layer has an energy to break at 23° C. of 13 to 80 MJ/m$^3$.

6 Claims, 1 Drawing Sheet

(51) Int. Cl.
*C09J 7/38* (2018.01)
*C09J 7/24* (2018.01)
*C09J 7/25* (2018.01)
*C09J 133/08* (2006.01)
*H01L 21/78* (2006.01)

(52) U.S. Cl.
CPC .............. *C09J 7/385* (2018.01); *C09J 133/08* (2013.01); *H01L 21/78* (2013.01); *C09J 2423/006* (2013.01); *C09J 2433/00* (2013.01); *C09J 2467/006* (2013.01)

(58) Field of Classification Search
CPC ......... H01L 21/304; C09J 7/241; C09J 7/255; C09J 7/29; C09J 7/385; C09J 133/08; C09J 2423/006; C09J 2433/00; C09J 2467/006; C09J 4/06; C09J 2203/326; C09J 2301/312; C09J 2301/414; C09J 2433/001; C09J 201/00; C09J 7/20; C09J 7/38; C08F 220/1804; C08F 220/1811; C08F 265/06; C09D 4/06
See application file for complete search history.

(56) References Cited

U.S. PATENT DOCUMENTS

| | | | |
|---|---|---|---|
| 9,534,151 | B2 | 1/2017 | Fujimoto et al. |
| 10,460,973 | B2 | 10/2019 | Tominaga et al. |
| 10,854,495 | B2 | 12/2020 | Aizawa et al. |
| 2002/0025431 | A1* | 2/2002 | Sawamura ................ C09J 7/22 428/343 |
| 2011/0057331 | A1* | 3/2011 | Hayashi .............. H01L 21/6836 257/E23.141 |
| 2012/0315438 | A1* | 12/2012 | Tanaka .................... B32B 27/08 428/458 |
| 2013/0171449 | A1* | 7/2013 | Maruyama ............. C09J 153/02 428/343 |

FOREIGN PATENT DOCUMENTS

| | | |
|---|---|---|
| JP | 201160848 A | 3/2011 |
| JP | 2011171588 A | 9/2011 |
| JP | 2011216563 A | 10/2011 |
| JP | 2012043929 A | 3/2012 |
| JP | 2012094834 A | 5/2012 |
| JP | 2012209363 A | 10/2012 |
| JP | 5068793 B2 | 11/2012 |
| JP | 2015183008 A | 10/2015 |
| WO | 2017149981 A1 | 9/2017 |
| WO | 2017150675 A1 | 9/2017 |
| WO | 2017150676 A1 | 9/2017 |
| WO | 201866480 A1 | 4/2018 |
| WO | 2018066408 A1 | 4/2018 |

OTHER PUBLICATIONS

English Abstract for JP2005343997 A, Dec. 15, 2005.
English Abstract for JP2011060848 A, Mar. 24, 2011.
English Abstract for JP2011171588 A, Sep. 1, 2011.
English Abstract forJP2011216563 A, Oct. 27, 2011.
English Abstract for JP2012043929 A, Mar. 1, 2012.
English Abstract for JP2012094834 A, May 17, 2012.
English Abstract for JP2012209363 A, Oct. 25, 2012.
English Abstract for WO2017150676 A1, Sep. 8, 2017.
English Abstract for WO2017150675 A1, Sep. 8, 2017.
English Abstract for WO2018066480 A1, Apr. 12, 2018.
English Abstract for WO2018066408 A1, Apr. 12, 2018.
International Search Report for Application No. PCT/JP2019/022165, dated Jul. 30, 2019.
International Search Report for Application No. PCT/JP2019/022162, dated Aug. 6, 2019.
English Abstract forJP 2015183008A, Oct. 22, 2015.
English Abstract for JP 5068793B2, Nov. 7, 2012.
English translation of International Preliminary Report on Patentability for Application No. PCT/JP2019/022162, dated Jan. 2021.
English translation of Abstract for TW 201800522A, Jan. 1, 2018.
English translation of Abstract for WO 2017149981A1, Sep. 8, 2017.

* cited by examiner

SEMICONDUCTOR PROCESSING ADHESIVE TAPE AND METHOD OF MANUFACTURING SEMICONDUCTOR DEVICE

This application is a U.S. national stage application of PCT/JP2019/022162 filed on 4 Jun. 2019 and claims priority to Japanese patent document 2018-121127 filed on 26 Jun. 2018, the entireties of which are incorporated herein by reference.

TECHNICAL FIELD

The present invention relates to a semiconductor processing adhesive tape. More specifically, the present invention relates to a semiconductor processing adhesive tape preferably used for temporarily holding a semiconductor wafer and a chip when a semiconductor device is produced by providing a groove to a surface of the wafer or by providing a modified region inside the wafer by laser, and then dicing the wafer using a stress applied during wafer backside grinding. The present invention also relates to a method of manufacturing the semiconductor device using the semiconductor processing adhesive tape.

BACKGROUND

As various electronic devices have become more compact and have developed to have many functionalities, a semiconductor chip mounted on these electronic devices is also demanded to be more compact and thinner. In order to make the chip thinner, generally a back surface of the semiconductor wafer is ground to regulate the thickness. Also, in order to obtain a thin chip, a method called a dicing before grinding method (DBG method) may be used in which a groove with a predetermined depth is formed from the front surface side of the wafer by a dicing blade, and then a wafer is ground from the back surface to dice the wafer, thereby the chip is obtained. In DBG, backside grinding of the wafer and dicing of the wafer can be performed at the same time, thus a thin chip can be manufactured efficiently.

Conventionally, during backside grinding of the semiconductor wafer and during manufacturing of the chip by DBG, in order to protect a circuit on the surface of the wafer or to hold the semiconductor wafer and the semiconductor chip, generally an adhesive tape which is called a back grind sheet is adhered to the front surface of the wafer.

As the backside grind sheet used for DBG, an adhesive tape having a base and an adhesive layer provided on one surface of the base is used. As an example of such adhesive tape, Patent Document 1 (JP Patent Application Laid Open No. 2015-183008) proposes an adhesive sheet having a rigid base, a buffer layer provided on one surface of the rigid base, and an adhesive layer provided on the other side of the rigid base. Patent Document 1 discloses that a Young's modulus of the rigid base is 1000 MPa or more, and when a tip of a triangular pyramid shape indenter having a tip curvature radius of 100 nm and an edge angle of 115° is pressed in a speed of 10 μm/min, a depth needed for a compress load to reach 2 mN is 2.5 μm or more. Also, Patent Document 2 (JP Patent No. 5068793) proposes an adhesive sheet having an adhesive layer to at least one surface of a sheet formed by curing an energy ray curing composition. Patent Document 2 discloses that a breaking elongation of the adhesive sheet is 50% or more and a tensile modulus is 10 to 1000 MPa.

In recent years, as a modified example of a dicing before grinding method, a dicing method has been proposed in which a modified region is provided on the inside of the wafer and the wafer is diced using a stress applied during wafer backside grinding. Hereinbelow, such method may be referred as LDBG (Laser Dicing Before Grinding). In LDBG, the wafer is cut along a crystal axis direction using the modified region as a starting point. Therefore, chipping is less likely to occur in LDBG compared to the dicing before grinding method using a dicing blade. As a result, a chip with an excellent bending strength can be obtained, and also contributes to achieve even thinner chip. Also, compared to DBG which forms a groove of predetermined depth to the front surface of the wafer by a dicing blade, LDBG does not have an area to grind off by a dicing blade, which means that LDBG has a minimum kerf width, hence LDBG achieves excellent yield of chips.

In DBG and LDBG, When the wafer is performed with backside grinding using a grinder and the like to make extremely thin, if excess adhesive tape exists around the outer circumference of the wafer, the grinder may bite the excess adhesive tape. Therefore, the adhesive tape is cut along the outer circumference of wafer before backside grinding. However, when the adhesive tape disclosed in Patent Documents 1 and 2 is used, if the chip is thinned to 30 μm or less, chipping and breaking of the chip (hereinafter, this may be referred as "chip crack") occurred in some cases.

[Patent Document 1] JP Patent Application Laid Open No. 2015-183008

[Patent Document 2] JP Patent No. 5068793

SUMMARY

As a result of keen study to solve the above object, the present inventors have found that chip crack occurs due to a tape debris which is generated when the adhesive tape is being cut along an outer circumference of the wafer by a cutter after the adhesive tape is adhered to the semiconductor wafer. After the adhesive tape is adhered to the wafer and the adhesive tape is cut along the outer circumference of the wafer, the wafer is placed on a chuck table via the adhesive tape, and backside grinding is performed using a grinder and the like. Here, if the tape debris exists between the adhesive tape and the chuck table, the adhesive tape and the wafer may deflect due to the tape debris, and a grinding surface of the wafer may be slightly warped. If the wafer with such warpage is ground, the grinder may be caught at a warped part, and the wafer cannot be ground uniformly which easily causes chip crack.

The tape debris is generated when the adhesive tape is cut by a cutter. Specifically, the tape debris is generated when a part of the adhesive tape is peeled or teared off while cutting the adhesive tape. Also, the tape debris may be easily generated when a part of the adhesive tape adheres to a blade of the cutter.

The present invention is achieved in view of such conventional technology, and the object is to provide a semiconductor processing adhesive tape capable of suppressing a chip crack even when it is used for DBG or LBDG.

The gist of the present invention to achieve the above-object is described in below.

(1) A semiconductor processing adhesive tape including a base, a buffer layer provided at least on one surface of the base, and an adhesive layer provided on the other surface of the base, wherein
a breaking energy at 23° C. of the buffer layer is 13 to 80 MJ/m$^3$.

(2) The semiconductor processing adhesive tape according to (1), wherein a Young's modulus at 23° C. of the base is 1000 MPa or more.

(3) The semiconductor processing adhesive tape according to (1) or (2), wherein the buffer layer is a cured product of a buffer layer forming composition including an energy ray polymerizable compound.

(4) The semiconductor processing adhesive tape according to any one of (1) to (3), wherein a thickness of the adhesive layer is less than 100 μm.

(5) A semiconductor processing adhesive tape including a base and an adhesive layer provided at least on one surface of the base, wherein a breaking energy at 23° C. of the base is 13 to 80 MJ/m$^3$.

(6) A method for producing a semiconductor device including steps of;

cutting the semiconductor processing adhesive tape according to any one of (1) to (5) along an outer circumference of a semiconductor wafer which is adhered with the semiconductor processing adhesive tape on the surface of the semiconductor wafer;

forming a groove from a front surface side of the semiconductor wafer or forming a modified region inside the semiconductor wafer from the front surface or a back surface of the semiconductor wafer;

dicing the semiconductor wafer, of which the adhesive tape is adhered on the front surface and the groove or the modified region is formed, using the groove or the modified region as a starting point for forming a plurality of chips by grinding from the back surface; and releasing the semiconductor processing adhesive tape from the plurality of chips.

The semiconductor processing adhesive tape according to the present invention is capable of reducing the tape debris which is generated when the adhesive tape is cut along the outer circumference of the wafer by a cutter. As a result, cracking of the semiconductor chip is suppressed.

DETAILED DESCRIPTION

Hereinafter, a semiconductor processing adhesive tape according to the present invention will be described in further detail. First, main terms used in the present specification is described.

In the present specification, for example, "(meth)acrylate" is used as a term indicating both "acrylate" and "methacrylate", and the same applies to other similar terms.

The term "semiconductor processing" includes steps such as carrying a semiconductor wafer, backside grinding, dicing, and picking up semiconductor chips.

A "front surface" of a semiconductor wafer refers to a surface on which circuits are formed, and a "back surface" refers to a surface on which no circuit is formed.

The dicing of a semiconductor wafer means dividing a semiconductor wafer into individual circuits to obtain semiconductor chips.

DBG refers to a method of forming a groove having a predetermined depth to a front surface side of a wafer, then grinding from a back surface of the wafer and dicing the wafer by grinding. The groove formed to the front surface side of the wafer is formed by a method such as blade dicing, laser dicing, plasma dicing, and the like. Also, LDBG is a modified example of DBG, and refers to a method of providing a modified region to the inside of a wafer by a laser and dicing the wafer by means of, for example, a stress applied when the back surface of the wafer is ground.

Next, the configurations of respective members of the semiconductor processing adhesive tape according to the present invention will now be described in further detail. In a first embodiment, descriptions will be given, focusing on an adhesive tape that includes a base, a buffer layer provided on at least one surface of the base, and an adhesive layer provided on the other surface of the base. In a second embodiment, descriptions will be given, focusing on a semiconductor processing adhesive tape that includes a base and an adhesive layer provided on at least one surface of the base. Note that, the semiconductor processing adhesive tape according to the present invention may be simply referred as an "adhesive tape".

First Embodiment

Figure 1:
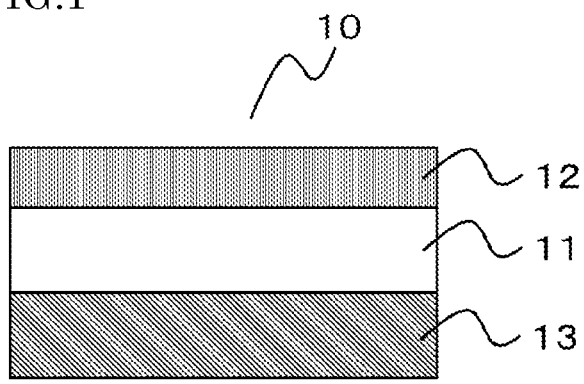
FIG. 1 is a schematic diagram of an adhesive sheet of the first embodiment according to the present invention.

As shown in FIG. 1, in the first embodiment according to the present invention, an adhesive tape 10 is a laminate including a base 11, a buffer layer 12 provided at least on one surface of the base 11, and an adhesive layer 13 provided on the other surface of the base 11. Note that, other constituent layers besides mentioned in above may be also included. For example, a primer layer may be formed to the surface of the base on the adhesive layer side, and a release sheet for protecting the adhesive layer until use may be laminated on the surface of the adhesive layer. Also, the base may be a single layer, or may be multilayers. Same applies to the buffer layer and the adhesive layer. Hereinafter, the configuration of respective members of the semiconductor processing adhesive tape according to the first embodiment will now be described in further detail.

[Base]

The base preferably has a Young's modulus at 23° C. of 1000 MPa or more. If a base having a Young's modulus of less than 1000 MPa is used, a retaining capability of the semiconductor processing adhesive tape to a semiconductor wafer or semiconductor chips decreases; and it is therefore impossible to suppress vibrations and the like when backside grinding is performed and chipping or breakage of semiconductor chips may easily occur. On the other hand, when the base has a Young's modulus at 23° C. of 1000 MPa or more, the retaining capability of the adhesive tape to the semiconductor wafer or semiconductor chips increases, and it is thereby possible to suppress vibrations and the like when backside grinding is performed, thus chipping and breakage of the semiconductor chips can be suppressed. Also, it is possible to reduce a stress applied when the adhesive tape is released from the semiconductor chips, thus chipping and breakage of the chips while releasing the adhesive tape can be suppressed. Further, a workability can also be improved while adhering the adhesive tape to the semiconductor wafer. From such point of view, the Young's modulus of the base at 23° C. is more preferably 1800 to 30000 MPa, and even more preferably 2500 to 6000 MPa.

A thickness of the base is not particularly limited, and preferably it is 110 μm or less, more preferably 15 to 110 μm, and even more preferably 20 to 105 μm. By setting the thickness of the base to be 110 μm or less, a releasing force of the adhesive tape can be controlled easily. By setting the thickness to 15 μm or more, the base can easily function as a support of the adhesive tape.

A material of the base is not particularly limited as long as the base satisfies the above-mentioned physical properties, and various resin films can be used. Here, as the base having a Young's modulus at 23° C. of 1000 MPa or more, for example, resin films such as polyethylene terephthalate, polyethylene naphthalate, polybutylene terephthalate, polyesters such as wholly aromatic polyester and the like, polyimide, polyamide, polycarbonate, polyacetal, modified-polyphenyleneoxide, polyphenylene sulfide, polysulfone, polyether ketone, biaxially oriented polypropylene, and the like may be mentioned.

Among these resin films, a film including at least one selected from a polyester film, a polyamide film, a polyimide film, and a biaxially oriented polypropylene film is preferable; a film including a polyester film is more preferable; and a film containing a polyethylene terephthalate film is even more preferable.

The base may include a plasticizer, a lubricant, an infrared absorber, an ultraviolet absorber, a filler, a colorant, an antistatic agent, an antioxidant, a catalyst, and the like as long as the effects of the present invention are not impaired. Also, the base may be transparent or opaque, and may be colored or vapor-deposited as desired.

At least one surface of the base may be subjected to an adhesion treatment such as a corona treatment in order to improve adhesion with at least one of the buffer layer and the adhesive layer. The base may include the above-mentioned resin film and an easy-adhesion layer which is coated to at least one of the surfaces of the resin film.

An easy-adhesion layer forming composition which is used to form the easy-adhesion layer is not particularly limited, and for example, a composition including a polyester-based resin, a urethane-based resin, a polyester-urethane-based resin, an acrylic resin and the like may be mentioned. The easy-adhesion layer forming composition may include a crosslinking agent, a photopolymerization initiator, an antioxidant, a softener (plasticizer), a filler, a rust inhibitor, a pigment, a dye, and the like, if needed.

The easy-adhesion layer has a thickness of preferably 0.01 to 10 μm and more preferably 0.03 to 5 μm. Note that, since the easy-adhesion layer in examples of the present application is thin with respect to the thickness of the base, the thickness of the resin film including the easy-adhesion layer and the thickness of the base are substantially the same. Also, since the material of the easy-adhesion layer is soft, the Young's modulus is barely affected, and thus the Young's modulus of the base is substantially the same as the Young's modulus of the resin film even when t the base includes the easy-adhesion layer.

For example, the Young's modulus of the base can be controlled by choice of the resin composition, addition of a plasticizer, and conditions of stretching while producing the resin film. Specifically, when a polyethylene terephthalate film is used as the base, the Young's modulus of the base tends to decrease if the content ratio of the ethylene component in the copolymerization component increases. The Young's modulus of the base tends to decrease if the amount of the plasticizer is large relative to the amount of the resin composition constituting the base.

[Buffer Layer]

The buffer layer allows to relieve the stress applied during backside grinding of the semiconductor wafer, and prevents chipping and breakage of the semiconductor wafer. After the adhesive tape is adhered to the semiconductor wafer and the adhesive tape is cut along the outer circumference of the semiconductor wafer, it is placed on a chuck table via the adhesive tape and then backside grinding is performed. Since the adhesive tape includes the buffer layer as a constituent layer, the semiconductor wafer is appropriately held by the chuck table. On the other hand, since the buffer layer is soft compared to the base, it has been found that the tape debris is generated when the adhesive tape is cut. As a result of keen study, it is found that when the buffer layer satisfies the following properties, the tape debris can be reduced.

The breaking energy at 23° C. of the buffer layer is 13 to 80 MJ/m$^3$. The adhesive tape is adhered to the semiconductor wafer around normal temperature (23° C.), and then the adhesive tape is cut along the outer circumference of the wafer. When the breaking energy at normal temperature (23° C.) of the buffer layer is 13 to 80 MJ/m$^3$, the buffer layer does not deform even if the blade of the cutter contacts while cutting, or it may deform momentarily when the blade contacts however it will return to the initial form instantaneously. Thus, warpage and tearing of the buffer layer while cutting is suppressed, and the tape debris is reduced as well. On the other hand, when the breaking energy at 23° C. of the buffer layer is lower than 13 MJ/m$^3$, the buffer layer is deformed when the blade of the cutter contacts while cutting and does not regain the original form, hence the buffer layer may warp or tear off which may generate the tape debris. Also, when the breaking energy at 23° C. of the buffer layer is larger than 80 MJ/m$^3$, the buffer layer may not be cut by the cutter in some cases, and also the blade of the cutter may abrade.

Note that, even in case the blade of the cutter is heated for cutting, if the breaking energy at 23° C. of the buffer layer is 13 to 80 MJ/m$^3$, warpage and tearing of the buffer layer during cutting is suppressed and the tape debris can be reduced.

In view of mentioned in above, the breaking energy at 23° C. of the buffer layer is preferably 13 to 60 MJ/m$^3$, more preferably 14 to 58 MJ/m$^3$, and even more preferably 15 to 37 MJ/m$^3$.

The breaking energy is a value obtained by integrating to a breaking point in a stress-strain curve which is a curve of stress and strain obtained from a tensile test at 23° C. based on JIS K7161:1997 and JIS K7127:1999. The strain (mm) can be calculated from "initial length of test pieces (mm)× elongation (%)". Note that, a breaking stress and a breaking elongation which are described in below are respectively stress and elongation at the point of breaking during the tensile test.

From the point of obtaining the breaking energy of the above-mentioned range, the breaking stress at 23° C. of the buffer layer is preferably 15 to 300 MPa, more preferably 20 to 250 MPa, and even more preferably 22 to 200 MPa.

The breaking stress can be measured based on JIS K7161:1994 and JIS K7127:1999.

Also, from the point of obtaining the breaking energy of the above-mentioned range, the breaking elongation at 23° C. of the buffer layer is preferably 50 to 400%, more preferably 70 to 350%, and even more preferably 100 to 300%.

The breaking elongation can be measured based on JIS K7161:1994 and JIS K7127:1999.

The buffer layer is a layer softer than the base. Therefore, the Young's modulus at 23° C. of the buffer layer is smaller than the Young's modulus at 23° C. of the base. Specifically, the Young's modulus at 23° C. of the buffer layer is preferably less than 1000 MPa, more preferably 700 MPa or less, and even more preferably 500 MPa or less.

The thickness of the buffer layer is preferably 1 to 100 μm, more preferably 5 to 80 μm, and even more preferably 10 to 60 μm. By setting the thickness of the buffer layer within the above-mentioned range, the buffer layer can release the stress appropriately during backside grinding.

The buffer layer is preferably a cured product of the buffer layer forming composition including the energy ray polymerizable compound. Also, it may be a layer including a polyolefin resin film, or a layer including polyether as a main agent.

Below describe components included in the layer formed of the buffer layer forming composition including the energy ray polymerizable compound; and components included in the layer including a polyolefin resin film in this order.

<Layer Formed of Buffer Layer Forming Composition Including Energy ray Polymerizable Compound>

The buffer layer forming composition including the energy ray polymerizable compound can be cured by irradiating energy ray. Note that, the term "energy ray" refers to ultraviolet rays, electron beams, and the like; and preferably ultraviolet rays are used.

Also, more specifically, the buffer layer forming composition including the energy ray polymerizable compound preferably includes a urethane (meth)acrylate (a1). By including urethane (meth)acrylate (a1) in the buffer layer forming composition, the breaking energy of the buffer layer is easily within the above-mentioned range. Also, in addition to the above-mentioned (a1), the buffer layer forming composition preferably includes a polymerizable compound (a2) having an alicyclic group or a heterocyclic group having 6 to 20 ring atoms and/or a polymerizable compound (a3) having a functional group. Also, in addition to above-mentioned components (a1) to (a3), the buffer layer forming composition may include a polyfunctional polymerizable compound (a4). Furthermore, the buffer layer forming composition preferably includes a photopolymerization initiator, and other additives and resin components may be included within a range which does not compromise the effects of the present invention.

In below, components included in the buffer layer forming composition including the energy ray polymerizable compound are described.

(Urethane (Meth)Acrylate (a1))

The urethane (meth)acrylate (a1) is a compound having at least a (meth)acryloyl group and urethane bonds, and has a property of being polymerized and cured by energy ray irradiation. The urethane (meth)acrylate (a1) is an oligomer or a polymer.

The weight average molecular weight (Mw) of the component (a1) is preferably 1000 to 100000, more preferably 2000 to 60000, and even more preferably 10000 to 30000. A number of (meth)acryloyl groups (which may also be referred to as "number of functional groups" in the following description) in the component (a1) may be monofunctional, bifunctional, or trifunctional or greater; and monofunctional or bifunctional is preferable.

The component (a1) can be obtained by, for example, reacting a (meth)acrylate having a hydroxyl group with a terminal isocyanate urethane prepolymer which is obtained by reacting a polyol compound with a polyvalent isocyanate compound. Note that, as the component (a1), one kind may be used alone, or two or more kinds may be combined for use.

The polyol compound as a material of the component (a1) is not particularly limited as long as it is a compound having two or more hydroxy groups. Specific examples of the polyol compound include alkylene diol, polyether type polyol, polyester type polyol, polycarbonate type polyol, and the like. Among these, polyester type polyol or polycarbonate type polyol is preferable.

The polyol compound may be any one of bifunctional diol, trifunctional triol, and tetrafunctional polyol or greater; but bifunctional diol is preferable; and polyester type diol or polycarbonate type diol is more preferable.

Examples of the polyvalent isocyanate compound include; aliphatic polyisocyanates such as tetramethylene diisocyanate, hexamethylene diisocyanate, trimethylhexamethylene diisocyanate, and the like; alicyclic diisocyanates such as isophorone diisocyanate, norbornane diisocyanate, dicyclohexylmethane-4, 4'-diisocyanate, dicyclohexylmethane-2, 4'-diisocyanate, ω-ω'-diisocyanate dimethylcyclohexane, and the like; and aromatic diisocyanates such as 4,4'-diphenylmethane diisocyanate, tolylene diisocyanate, xylylene diisocyanate, tolidine diisocyanate, tetramethylene xylylene diisocyanate, naphthalene-1, 5-diisocyanate, and the like.

Among these, isophorone diisocyanate, hexamethylene diisocyanate, and xylylene diisocyanate are preferable.

Urethane (meth)acrylate (a1) can be obtained by reacting (meth)acrylate having a hydroxy group with a terminal isocyanate urethane prepolymer obtained from the reaction of the above-mentioned polyol compound and a polyvalent isocyanate compound. The (meth)acrylate having a hydroxy group is not particularly limited as long as it is a compound having at least a hydroxy group and a (meth)acryloyl group in one molecule.

Specific examples of the (meth)acrylate having a hydroxy group include; hydroxyalkyl (meth)acrylates such as 2-hydroxyethyl (meth)acrylate, 2-hydroxypropyl (meth)acrylate, 4-hydroxybutyl (meth)acrylate, 4-hydroxycyclohexyl (meth)acrylate, 5-hydroxycyclooctyl (meth)acrylate, 2-hydroxy-3-phenyloxypropyl (meth)acrylate, pentaerythritol tri(meth)acrylate, polyethylene glycol mono(meth)acrylate, polypropylene glycol mono(meth)acrylate, and the like; hydroxy group-containing (meth)acrylamides such as N-methylol (meth)acrylamide and the like; and a reaction product obtained by reacting (meth)acrylic acid with vinyl alcohol, vinyl phenol, and diglycidyl ester of bisphenol A.

Among these, hydroxyalkyl (meth)acrylate is preferable, and 2-hydroxyethyl (meth)acrylate is more preferable.

Preferable condition for reacting terminal isocyanate urethane prepolymer and (meth)acrylate having a hydroxy group is under 60° C. to 100° C. for 1 to 4 hours in the presence of a solvent or a catalyst added if necessary.

The content of the component (a1) in the buffer layer forming composition is preferably 10 to 70 mass %, and more preferably 20 to 60 mass % with respect to a total amount (100 mass %) of the buffer layer forming composition.

(Polymerizable Compound (a2) Having an Alicyclic Group or a Heterocyclic Group Having 6 to 20 Ring-Forming Atoms)

The component (a2) is a polymerizable compound having an alicyclic group or a heterocyclic group having 6 to 20 ring-forming atoms; more preferably a compound having at least one (meth)acryloyl group; and more preferably a compound having one (meth)acryloyl group. By using the component (a2), a film-forming property of the buffer layer forming composition can be improved.

Although the definition of the component (a2) and the definition of the component (a3) which will be described in below partially overlap, the overlapping part is included in the component (a3). For example, a compound having at least one (meth)acryloyl group; an alicyclic group or a heterocyclic group having 6 to 20 ring-forming atoms; a functional group such as a hydroxyl group, an epoxy group, an amide group, an amino group, and the like; are included in the definitions of both of the component (a2) and the component (a3), but in the present invention, it is considered that such compounds are included in the component (a3).

The number of ring-forming atoms of the alicyclic group or heterocyclic group included in the component (a2) is preferably 6 to 20, more preferably 6 to 18, even more preferably 6 to 16, and particularly preferably 7 to 12. Examples of the atom forming the ring structure of the heterocyclic group include a carbon atom, a nitrogen atom, an oxygen atom, a sulfur atom, and the like.

Note that, the number of ring-forming atoms represents the number of atoms constituting the ring itself of a compound having a structure in which atoms are bonded in a ring form; and the number of ring-forming atoms does not include an atom which is not an constituent of the ring (for example, a hydrogen atom bonded to an atom constituting the ring) or an atom included in a substituent when the ring is substituted by the substituent.

Specific examples of the component (a2) include; alicyclic group-containing (meth)acrylates such as isobornyl (meth)acrylate, dicyclopentenyl (meth)acrylate, dicyclopentanyl (meth)acrylate, dicyclopentenyloxy (meth)acrylate, cyclohexyl (meth)acrylate, adamantane (meth)acrylate, and the like; and heterocyclic group-containing (meth)acrylates such as tetrahydrofurfuryl (meth)acrylate, morpholine (meth)acrylate, and the like.

Note that, as the component (a2), one kind of the component (a2) may be used alone, or two or more kinds may be combined for use.

Among the alicyclic group-containing (meth)acrylates, isobornyl (meth)acrylate is preferable; and tetrahydrofurfuryl (meth)acrylate is preferable among the heterocyclic group-containing (meth)acrylates.

A content of the component (a2) in the buffer layer forming composition is preferably 10 to 80 mass % and more preferably 20 to 70 mass % with respect to a total amount (100 mass %) of the buffer layer forming composition.

(Polymerizable Compound (a3) Having a Functional Group)

The component (a3) is a polymerizable compound including a functional group such as a hydroxyl group, an epoxy group, an amide group, an amino group, and the like; and the component (a3) is preferably a compound having at least one (meth)acryloyl group, more preferably a compound having one (meth)acryloyl group.

The component (a3) has a good compatibility with the component (a1), and the component (a3) allows to easily adjust a viscosity of the buffer layer forming composition within an appropriate range. Also, the braking energy of the buffer layer formed from such composition tends to be easily within the above-mentioned range, and even when the buffer layer is made relatively thin, a good buffering property can be attained.

Examples of the component (a3) include a hydroxyl group-containing (meth)acrylate, an epoxy group-containing compound, an amide group-containing compound, an amino group-containing (meth)acrylate, and the like.

Examples of the hydroxyl group-containing (meth)acrylate include 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, phenylhydroxypropyl (meth)acrylate, 2-hydroxy-3-phenoxypropyl acrylate, and the like.

Examples of the epoxy group-containing compound include glycidyl (meth)acrylate, methylglycidyl (meth)acrylate, allyl glycidyl ether, and the like; and among these, epoxy group-containing (meth)acrylates such as glycidyl (meth)acrylate, methylglycidyl (meth)acrylate, and the like are preferable.

Examples of the amide group-containing compound include (meth)acrylamide, N, N-dimethyl (meth)acrylamide, N-butyl (meth)acrylamide, N-methylol (meth)acrylamide, N-methylolpropane (meth)acrylamide, N-methoxymethyl (meth)acrylamide, N-butoxymethyl (meth)acrylamide, and the like.

Examples of the amino group-containing (meth)acrylate include primary amino group-containing (meth)acrylate, secondary amino group-containing (meth)acrylate, tertiary amino group-containing (meth)acrylate, and the like.

Among these, hydroxyl group-containing (meth)acrylate is preferable, and hydroxyl group-containing (meth)acrylate having an aromatic ring such as phenylhydroxypropyl (meth)acrylate is more preferable.

Note that, as the component (a3), one kind of the component (a3) may be used alone, or two or more kinds may be combined for use.

In order to easily attain the breaking energy of the buffer layer within the above-mentioned range and to improve the film forming property of the buffer layer forming composition, a content of the component (a3) in the buffer layer forming composition is preferably 5 to 40 mass %, more preferably 7 to 35 mass %, and even more preferably 10 to 30 mass % with respect to a total amount (100 mass %) of the buffer layer forming composition.

In addition, the content ratio [(a2)/(a3)] of the component (a2) and the component (a3) in the buffer layer forming composition is preferably 0.5 to 3.0, more preferably 1.0 to 3.0, even more preferably 1.3 to 3.0, and particularly preferably 1.5 to 2.8.

(Polyfunctional Polymerizable Compound (a4))

The polyfunctional polymerizable compound refers to a compound having two or more photopolymerizable unsaturated groups. A photopolymerizable unsaturated group is a functional group containing a carbon-carbon double bond, and examples thereof include a (meth)acryloyl group, a vinyl group, an allyl group, a vinylbenzyl group, and the like. Two or more kinds of photopolymerizable unsaturated groups may be used in combination. A three-dimensional network structure (crosslinked structure) is formed by a reaction between the photopolymerizable unsaturated group in the polyfunctional polymerizable compound and the (meth)acryloyl group in the component (a1), or by the photopolymerizable unsaturated groups in the component (a4) reacting with one another. When a polyfunctional polymerizable compound is used, the crosslinked structure formed by energy ray irradiation increases compared to a case in which a compound including only one photopolymerizable unsaturated group is used, thus the buffer layer exhibits a specific viscoelasticity, and the breaking energy can be easily regulated within the above-mentioned range.

Although the definition of the component (a4), and the definition of the component (a2) and the component (a3) described partially overlap, and the overlapping part is considered included in the component (a4). For example, a compound having an alicyclic group or a heterocyclic group having 6 to 20 ring-forming atoms and having two or more (meth)acryloyl groups is included in the definitions of both the component (a4) and the component (a2), but in the present invention, it is considered included in the component (a4). Also, although a compound containing a functional group such as a hydroxyl group, an epoxy group, an amide group, an amino group, and the like and also containing two or more (meth)acryloyl groups is included in the definition of both the component (a4) and the component (a3), but in the present invention, it is considered included in the component (a4).

In view of the foregoing, the number of the photopolymerizable unsaturated groups (the number of functional groups) in the polyfunctional polymerizable compound is preferably 2 to 10, and more preferably 3 to 6.

The weight average molecular weight of the component (a4) is preferably 30 to 40000, more preferably 100 to 10000, and even more preferably 200 to 1000.

Specific examples of the component (a4) include diethylene glycol di(meth)acrylate, ethylene glycol di(meth)acrylate, tetraethylene glycol di(meth)acrylate, neopentyl glycol di(meth)acrylate, 1,6-hexanediol di(meth)acrylate, trimethylolpropane tri(meth)acrylate, pentaerythritol tri(meth)acrylate, pentaerythritol tetra(meth)acrylate, dipentaerythritol hexa(meth)acrylate, divinyl benzene, vinyl (meth)acrylate, divinyl adipate, N, N'-methylenebis (meth)acrylamide, and the like.

As the component (a4), one kind of the component (a4) may be used alone, or two or more kinds may be combined for use.

Among these, dipentaerythritol hexa(meth)acrylate is preferable.

A content of the component (a4) in the buffer layer forming composition is preferably 2 to 40 mass %, more preferably 3 to 20 mass %, and even more preferably 5 to 15 mass % with respect to a total amount (100 mass %) of the buffer layer forming composition.

(Polymerizable Compound (a5) Other than Components (a1) to (a4))

The buffer layer forming composition may include polymerizable compounds (a5) other than the above-mentioned components (a1) to (a4) as long as the effects of the present invention are not impaired.

Examples of the component (a5) include alkyl (meth) acrylates having an alkyl group having 1 to 20 carbon atoms; and vinyl compounds such as styrene, hydroxyethyl vinyl ether, hydroxybutyl vinyl ether, N-vinylformamide, N-vinylpyrrolidone, N-vinylcaprolactam, and the like. As the component (a5), one kind of the component (a5) may be used alone, or two or more kinds may be combined for use.

The content of the component (a5) in the buffer layer forming composition is preferably 0 to 20 mass %, more preferably 0 to 10 mass %, even more preferably 0 to 5 mass %, and particularly preferably 0 to 2 mass %.

(Photopolymerization Initiator)

When the buffer layer is formed, the buffer layer forming composition further preferably includes a photopolymerization initiator to reduce polymerization time by light irradiation and to reduce the amount of light irradiation.

Examples of the photopolymerization initiator include benzoin compounds, acetophenone compounds, acylphosphine oxide compounds, titanocene compounds, thioxanthone compounds, peroxide compounds, and further include photosensitizers such as amines, quinones, and the like. More specific examples include 1-hydroxycyclohexyl phenyl ketone, 2-hydroxy-2-methyl-1-phenyl-propane-1-one, benzoin, benzoin methyl ether, benzoin ethyl ether, benzoin isopropyl ether, benzylphenyl sulfide, tetramethylthiuram monosulfide, azobisisobutyrol nitrile, dibenzyl, diacetyl, 8-chloranthraquinone, bis (2, 4, 6-trimethylbenzoyl) phenylphosphine oxide, and the like.

As these photopolymerization initiators, one photopolymerization initiator may be used alone, or two or more thereof may be combined for use.

The content of the photopolymerization initiator in the buffer layer forming composition is preferably 0.05 to 15 parts by mass, more preferably 0.1 to 10 parts by mass, and even more preferably 0.3 to 5 parts by mass with respect to 100 parts by mass of the total amount of the energy ray polymerizable compound.

(Other Additives)

The buffer layer forming composition may include other additives as long as the effects of the present invention are not impaired. Examples of other additives include an antistatic agent, an antioxidant, a softener (plasticizer), a filler, a rust inhibitor, a pigment, a dye, and the like. When these additives are used, a content of each additive in the buffer layer forming composition is preferably 0.01 to 6 parts by mass, more preferably 0.1 to 3 parts by mass with respect to 100 parts by mass of the total amount of the energy ray polymerizable compound.

(Resin Component)

The buffer layer forming composition may contain a resin component as long as the effects of the present invention are not impaired. Examples of the resin component include a polyene-thiol-based resin; a polyolefin-based resin such as polybutene, polybutadiene, polymethylpentene, and the like; a thermoplastic resin such as a styrene-based copolymer, and the like. The content of these resin components in the buffer layer forming composition is preferably 0 to 20 mass %, more preferably 0 to 10 mass %, even more preferably 0 to 5 mass %, and particularly preferably 0 to 2 mass %.

The buffer layer formed of the buffer layer forming composition which includes the energy ray polymerizable compound is obtained by polymerizing and curing the buffer layer forming composition having the above-mentioned composition by energy ray irradiation. That is, the buffer layer is a cured product of the buffer layer forming composition. Thus, the buffer layer includes a polymerization unit derived from the component (a1). Also, the buffer layer preferably includes a polymerization unit derived from the component (a2) and/or a polymerization unit derived from the component (a3). Further, the buffer layer may include a polymerization unit derived from the component (a4) and/or a polymerization unit derived from the component (a5). The content ratio of each polymerization unit in the buffer layer usually matches with the ratio (feed ratio) of each component constituting the buffer layer forming composition. For example, when the content of the component (a1) in the buffer layer forming composition is 10 to 70 mass % with respect to a total amount (100 mass %) of the buffer layer forming composition, the buffer layer includes 10 to 70 mass % of the polymerization unit derived from the component (a1). Further, when the content of the component (a2) in the buffer layer forming composition is 10 to 80 mass % with respect to a total amount (100 mass %) of the buffer layer forming composition, the buffer layer includes 10 to 80 mass % of the polymerization unit derived from the component (a2). The same applies to the components (a3) to (a5).

<Layer Including Polyolefin Resin Film>

By forming the buffer layer using the layer including a polyolefin resin film, the breaking energy of the buffer layer is easily regulated within the above-mentioned range.

When the buffer layer is the layer including a polyolefin resin film, a stress relieving property may be lower than when the buffer layer is a layer formed by a buffer layer forming composition which includes an energy ray polymerizable compound. In this case, warpage may occur to the adhesive tape having the buffer layer formed of the layer including the polyolefin resin film on one surface of the base. The buffer layer formed by the layer including the polyolefin resin film is provided on at least one surface of the base, however from the point of preventing such problems, the buffer layer formed by the layer including a polyolefin resin film is preferably provided on the both faces of the base.

The polyolefin resin is not particularly limited, and examples thereof include polyethylene resins such as very low density polyethylene (VLDPE, density: 880 kg/m$^3$ or more and less than 910 kg/m$^3$), low density polyethylene (LDPE, density: 910 kg/m$^3$ or more and less than 930 kg/m$^3$), medium density polyethylene (MDPE, density: 930 kg/m$^3$ or more and less than 942 kg/m$^3$), high density polyethylene (HDPE, density: 942 kg/m$^3$ or more) and the like; a polypropylene resin; a polyethylene-polypropylene copolymer; an olefin-based elastomer (TPO); a cycloolefin resin; an ethylene-vinyl acetate copolymer (EVA); an ethylene-vinyl acetate maleic anhydride copolymer; an ethylene-(meth)acrylic acid copolymer; an ethylene-(meth) acrylic acid ester copolymer; an ethylene-(meth)acrylic acid ester-maleic anhydride copolymer; and the like.

These polyolefin resins may be used alone, or two or more thereof may be combined for use.

Among the above-mentioned polyolefin resins, a polyethylene resin is preferable, and a low-density polyethylene is more preferable in view of obtaining the buffer layer having specific physical properties.

The buffer layer may include additives such as a plasticizer, a lubricant, an infrared absorber, an ultraviolet absorber, a filler, a colorant, an antistatic agent, an antioxidant, a catalyst, and the like as long as the effects of the present invention are not impaired. Also, the buffer layer described above may be transparent or opaque, and may be colored or vapor-deposited as desired.

In the first embodiment, when the buffer layer is the cured product of the buffer layer forming composition including energy ray curable compound, the breaking energy at 23° C. of the buffer layer can be controlled by regulating the weight average molecular weight of the above-mentioned urethane (meth)acrylate (a1) and regulating the thickness of the buffer layer, and also by appropriately selecting the type of the monomer. Also, when the buffer layer is the layer including a polyolefin resin film, the breaking energy at 23° C. of the buffer layer can be controlled by regulating the density of polyolefin, and also by appropriately selecting the additives.

[Adhesive Layer]

The adhesive layer is not particularly limited as long as it has an appropriate pressure sensitive adhesiveness at normal temperature, and preferably the adhesive layer has a shear storage elastic modulus of 0.05 to 0.50 MPa at 23° C. Circuits and the like are formed on the semiconductor wafer, thus the surface of the wafer is usually uneven. By having the shear storage elastic modulus of the adhesive layer within the above-mentioned range, when the adhesive tape is adhered to the uneven surface of the wafer, the unevenness of the surface of the wafer and the adhesive layer can sufficiently contact with each other, and the adhesiveness of the adhesive layer is appropriately exhibited. Therefore, the adhesive tape can be securely adhered to the semiconductor wafer, and also the wafer surface can be appropriately protected while backside grinding is performed. From such point of view, the shear storage elastic modulus of the adhesive layer is more preferably 0.12 to 0.35 MPa.

Note that, the shear storage elastic modulus of the adhesive layer means a shear storage elastic modulus before curing by energy ray irradiation in case the adhesive layer is formed by an energy ray curable adhesive agent.

The shear storage elastic modulus can be measured by the following method. An adhesive layer having a thickness of approximately 0.5 to 1 mm is punched into a circular shape having a diameter of 7.9 mm, and then this is used as a measurement sample. Using a dynamic viscoelasticity measuring apparatus ARES manufactured by Rheometric Scientific Ltd., the elastic modulus of the measurement sample is measured while changing temperature at a temperature increasing rate of 3° C./min and at a frequency of 1 Hz within a temperature range of −30° C. to 150° C. The elastic modulus at the measurement temperature of 23° C. is defined as the shear storage elastic modulus at 23° C.

The thickness of the adhesive layer is preferably less than 100 μm, more preferably 5 to 80 μm, and even more preferably 10 to 70 μm. When the adhesive layer is made thin as mentioned in above, the tape debris generated while cutting the adhesive tape can be reduced, and also cracks to the semiconductor chips can be prevented even more easily which is generated during backside grinding.

The adhesive layer is formed by, for example, an acrylic-based adhesive agent, a urethane-based adhesive agent, a rubber-based adhesive agent, a silicone-based adhesive agent, and the like; and an acrylic-based adhesive agent is preferable.

Also, the adhesive layer is preferably formed by an energy ray curable adhesive agent. By forming the adhesive layer using an energy ray curable adhesive agent, the shear storage elastic modulus at 23° C. can be regulated within the above-mentioned range before curing by energy ray irradiation and the releasing force after curing can be easily regulated within 1000 mN/50 mm or less.

Specific examples of the adhesive agent will now be described in detail, but these are non-limiting examples, and the adhesive layer of the present invention should not be limited thereto.

As the energy ray curable adhesive agent, for example, in addition to a non-energy ray curable adhesive resin (also referred to as "adhesive resin I"), an energy ray curable adhesive composition including an energy ray curable compound other than the adhesive resin (also referred to as an "X-type adhesive composition" in the following) may be mentioned. Also, as the energy ray curable adhesive agent, an adhesive composition (also referred to as "Y-type adhesive composition" in the following) may also be used, which includes an energy ray curable adhesive resin (also referred to as "adhesive resin II" in the following) having an unsaturated group introduced into a side chain of a non-energy ray curable adhesive resin as a main component, and does not include an energy ray curable compound other than the adhesive resin.

Moreover, as the energy ray curable adhesive agent, a combination of an X-type and a Y-type may be used, that is, an energy ray curable adhesive composition (also referred to as an "XY-type adhesive composition" in the following) may be used which includes an energy ray curable compound other than an adhesive resin, in addition to the energy ray curable adhesive resin II.

Among these, the XY-type adhesive composition is preferably used. By using the XY-type, a sufficient adhesive property before curing can be attained and the releasing force against the semiconductor wafer after curing can be made sufficiently low.

Note that, the adhesive agent may be formed by a non-energy ray curable adhesive composition which does not cure by energy ray irradiation. The non-energy ray curable adhesive composition includes at least the non-energy ray curable adhesive resin I but does not include the energy ray curable adhesive resin II and the energy ray curable compound which are mentioned in above.

In below, the term "adhesive resin" is used as a term referring to one or both of the above-mentioned adhesive resin I and the adhesive resin II. Specific examples of the adhesive resin include an acrylic-based resin, a urethane-based resin, a rubber-based resin, a silicone-based resin, and the like; and an acrylic-based resin is preferable.

Below describes in further detail regarding an acrylic-based adhesive agent using the acrylic-based resin as the adhesive resin.

As the acrylic-based resin, an acrylic-based polymer (b) is used. The acrylic-based polymer (b) is obtained by polymerizing a monomer including at least alkyl (meth)acrylate, and includes a structural unit derived from alkyl (meth) acrylate. Examples of alkyl (meth)acrylate include those having 1 to 20 carbon atoms of the alkyl group, and the alkyl group may be linear or branched. Specific examples of alkyl (meth)acrylate include methyl (meth)acrylate, ethyl (meth) acrylate, isopropyl (meth)acrylate, n-propyl (meth)acrylate, n-butyl (meth)acrylate, 2-ethylhexyl (meth)acrylate, n-octyl (meth)acrylate, isooctyl (meth)acrylate, nonyl (meth)acrylate, decyl (meth)acrylate, undecyl (meth)acrylate, dodecyl (meth)acrylate, and the like. One kind of the alkyl (meth) acrylates may be used alone or two or more kinds may be combined for use.

Also, the acrylic-based polymer (b) preferably includes a structural unit derived from an alkyl (meth)acrylate having 4 or more carbon atoms of an alkyl group from the point of improving the adhesive strength of the adhesive layer. The alkyl (meth)acrylate preferably has 4 to 12 carbon atoms, and more preferably 4 to 6 carbon atoms. The alkyl (meth) acrylate having 4 or more carbon atoms of an alkyl group is preferably alkyl acrylate.

In the acrylic-based polymer (b), alkyl (meth)acrylate having 4 or more carbon atoms of an alkyl group is preferably 40 to 98 mass %, more preferably 45 to 95 mass %, and even more preferably 50 to 90 mass % with respect to the total amount of the monomers constituting the acrylic-based polymer (b) (also may be simply referred as "total amount of the monomer" in the following description).

In order to adjust the elastic modulus and the adhesive properties of the adhesive layer, preferably the acrylic-based polymer (b) is a copolymer containing a structural unit derived from alkyl (meth)acrylate having 1 to 3 carbon atoms of an alkyl group, in addition to a structural unit derived from alkyl (meth)acrylate having 4 or more carbon atoms of an alkyl group. The alkyl (meth)acrylate is preferably alkyl (meth)acrylate having 1 or 2 carbon atoms, more preferably methyl (meth)acrylate, and most preferably methyl methacrylate. In the acrylic-based polymer (b), alkyl (meth)acrylate having 1 to 3 carbon atoms of an alkyl group is preferably 1 to 30 mass %, more preferably 3 to 26 mass %, and even more preferably 6 to 22 mass % with respect to the total amount of the monomer.

The acrylic-based polymer (b) preferably has a structural unit derived from a functional group-containing monomer, in addition to the structural unit derived from the above-mentioned alkyl (meth)acrylate. Examples of the functional group of the functional group-containing monomer include a hydroxyl group, a carboxy group, an amino group, an epoxy group, and the like. The functional group-containing monomer reacts with a crosslinking agent described below to form crosslinking point, or reacts with an unsaturated group-containing compound and enables to introduce an unsaturated group to a side chain of the acrylic-based polymer (b).

Examples of the functional group-containing monomer include a hydroxyl group-containing monomer, a carboxy group-containing monomer, an amino group-containing monomer, an epoxy group-containing monomer, and the like. One kind of these monomers may be used alone or two or more kinds may be combined for use. Among these, a hydroxyl group-containing monomer and a carboxy group-containing monomer are preferable; and a hydroxyl group-containing monomer is more preferable.

Examples of the hydroxyl group-containing monomer include hydroxyalkyl (meth)acrylates such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, and the like; and unsaturated alcohols such as vinyl alcohol, allyl alcohol, and the like.

Examples of the carboxy group-containing monomer include ethylene unsaturated monocarboxylic acids such as (meth)acrylic acid, crotonic acid, and the like; and ethylene unsaturated dicarboxylic acids such as fumaric acid, itaconic acid, maleic acid, citraconic acid, and anhydrides thereof; and 2-carboxyethyl methacrylate.

The functional group-containing monomer is preferably 1 to 35 mass %, more preferably 3 to 32 mass %, and even more preferably 6 to 30 mass % with respect to the total amount of the monomers constituting the acrylic-based polymer (b).

Also, the acrylic-based polymer (b) may include a structural unit derived from a monomer copolymerizable with the above-mentioned acrylic-based monomers such as styrene, α-methyl styrene, vinyltoluene, vinyl formate, vinyl acetate, acrylonitrile, acrylamide, and the like.

The above-mentioned acrylic-based polymer (b) can be used as a non-energy ray curable adhesive resin I (acrylic-based resin). Examples of the energy ray curable acrylic resin include those obtained by reacting a compound having a photopolymerizable unsaturated group (also referred to as an unsaturated group-containing compound) with the functional group of the above-mentioned acrylic-based polymer (b).

The unsaturated group-containing compound is a compound having both a photopolymerizable unsaturated group and a substituent capable of bonding to a functional group of the acrylic-based polymer (b). Examples of the photopolymerizable unsaturated group include a (meth)acryloyl group, a vinyl group, an allyl group, a vinylbenzyl group, and the like; and a (meth)acryloyl group is preferable.

Also, as examples of the substituent capable of bonding to the functional group included in the unsaturated group-containing compound, an isocyanate group, a glycidyl group, and the like may be mentioned. Thus, examples of the unsaturated group-containing compound include (meth) acryloyloxyethyl isocyanate, (meth)acryloyl isocyanate, glycidyl (meth)acrylate, and the like.

Preferably, the unsaturated group-containing compound reacts with part of a functional group of the acrylic-based polymer (b); and specifically, more preferably the unsaturated group-containing compound reacts with 50 to 98 mol % and more preferably 55 to 93 mol % of the functional group included in the acrylic-based polymer (b). As such, in the energy ray curable acrylic resin, part of the functional group remains without being reacting with the unsaturated group-containing compound; and thereby crosslinking reaction by the crosslinking agent is facilitated.

Note that, the weight average molecular weight (Mw) of the acrylic-based resin is preferably from 300000 to 1600000, more preferably 400000 to 1400000, and even more preferably 500000 to 1200000.

(Energy Ray Curable Compound)

The energy ray curable compound included in the X-type or XY-type adhesive composition is preferably a monomer or an oligomer having an unsaturated group in its molecule, and capable of being polymerized and cured by energy ray irradiation.

Examples of such energy ray curable compounds include polyvalent (meth)acrylate monomers such as trimethylolpropane tri(meth)acrylate, pentaerythritol (meth)acrylate, pentaerythritol tetra(meth)acrylate, dipentaerythritol hexa(meth)acrylate, 1,4-butylene glycol di(meth)acrylate, 1,6-hexanediol (meth)acrylate, and the like; and oligomers such as urethane (meth)acrylate, polyester (meth)acrylate, polyether (meth)acrylate, epoxy (meth)acrylate, and the like.

Among these, a urethane (meth)acrylate oligomer is preferable since the molecular weight is relatively high and the shear storage elastic modulus of the adhesive layer is barely lowered.

The molecular weight (the weight average molecular weight in case of an oligomer) of the energy ray curable compound is preferably 100 to 12000, more preferably 200 to 10000, even more preferably 400 to 8000, and particularly preferably 600 to 6000.

The content of the energy ray curable compound in the X-type adhesive composition is preferably 40 to 200 parts by mass, more preferably 50 to 150 parts by mass, and even more preferably 60 to 90 parts by mass with respect to 100 parts by mass of the adhesive resin.

The content of the energy ray curable compound in the XY-type adhesive composition is preferably 1 to 30 parts by mass, more preferably 2 to 20 parts by mass, and even more preferably 3 to 15 parts by mass with respect to 100 parts by mass of the adhesive resin. In the XY-type adhesive composition, since the adhesive resin is energy ray curable, the releasing force can be sufficiently lowered after energy ray irradiation even if the content of the energy ray curable compound is small.

(Crosslinking Agent)

The adhesive composition preferably further includes a crosslinking agent. The crosslinking agent, for example, reacts with a functional group derived from a functional group-containing monomer included in the adhesive resin and thereby the adhesive resin is crosslinked. Examples of the crosslinking agent include isocyanate-based crosslinking agents such as tolylene diisocyanate, hexamethylene diisocyanate, and the like and also adducts thereof; epoxy-based crosslinking agents such as ethylene glycol glycidyl ether and the like; aziridine-based crosslinking agents such as hexane [1-(2-methyl)-aziridinyl] triphosphatriazine, and the like; and chelating-based crosslinking agents such as aluminum chelate and the like. One kind of these crosslinking agents may be used alone or two or more kinds may be combined for use.

Among these, an isocyanate-based crosslinking agent is preferable in view of increasing the cohesive force to improve the adhesive strength, and also because it is easy to obtain.

From the point of facilitating crosslinking reaction, the amount of the crosslinking agent is preferably 0.01 to 10 parts by mass, more preferably 0.03 to 7 parts by mass, and even more preferably 0.05 to 4 parts by mass with respect to 100 parts by mass of the adhesive resin.

(Photopolymerization Initiator)

When the adhesive composition is energy ray curable, the adhesive composition preferably further includes a photopolymerization initiator. By including the photopolymerization initiator, the curing reaction of the adhesive composition can be sufficiently facilitated even when energy ray having relatively low energy such as ultraviolet rays and the like is irradiated.

Examples of the photopolymerization initiator include benzoin compounds, acetophenone compounds, acylphosphinoxide compounds, titanocene compounds, thioxanthone compounds, peroxide compounds, and photosensitizers such as amines, quinones, and the like. More specific examples include 1-hydroxycyclohexyl phenyl ketone, 2-hydroxy-2-methyl-1-phenyl-propan-1-one, benzoin, benzoin methyl ether, benzoin ethyl ether, benzoin isopropyl ether, benzylphenyl sulfide, tetramethylthiuram monosulfide, azobisisobutyrol nitrile, dibenzyl, diacetyl, 8-chloranthraquinone, bis (2, 4, 6-trimethylbenzoyl) phenylphosphine oxide, and the like.

One kind of these photopolymerization initiators may be used alone or two or more kinds may be combined for use.

The content of the photopolymerization initiator is preferably 0.01 to 10 parts by mass, more preferably 0.03 to 5 parts by mass, and even more preferably 0.05 to 5 parts by mass with respect to 100 parts by mass of the adhesive resin.

(Other Additives)

The adhesive composition may contain other additives as long as the effects of the present invention are not impaired. Examples of other additives include an antistatic agent, an antioxidant, a softener (plasticizer), a filler, a rust inhibitor, a pigment, a dye, and the like. When such additives are used, the content of the additive is preferably 0.01 to 6 parts by mass with respect to 100 parts by mass of the adhesive resin.

From the point of improving the coating property of the adhesive composition against the base, the buffer layer, and the release sheet, the adhesive composition may be further diluted with an organic solvent to form the adhesive composition in a solution form.

Examples of the organic solvent include methyl ethyl ketone, acetone, ethyl acetate, tetrahydrofuran, dioxane, cyclohexane, n-hexane, toluene, xylene, n-propanol, isopropanol, and the like.

Regarding these organic solvents, the organic solvent used for the synthesis of the adhesive resin may be used as it is, or one or more kinds of organic solvents other than the ones used for the synthesis may be added so that the solution of the adhesive composition can be uniformly coated.

[Release Sheet]

A release sheet may be adhered to a surface of the adhesive tape. Specifically, the release sheet is adhered to the surface of the adhesive layer of the adhesive tape. The release sheet protects the adhesive layer during transportation and while storing by adhering to the surface of the adhesive layer. The release sheet is adhered to the adhesive tape in a releasable manner and it is released and removed from the adhesive tape before the adhesive tape is used (that is, before the wafer is adhered).

As the release sheet, a release sheet having at least one surface performed with a releasing treatment is used, and a specific example is a release sheet of in which a release agent is applied to a release sheet base.

The release sheet base is preferably a resin film, and examples of the resin constituting the resin film include polyester resin films such as a polyethylene terephthalate resin, a polybutylene terephthalate resin, a polyethylene naphthalate resin, and the like; and polyolefin resins such as a polypropylene resin, a polyethylene resin, and the like.

Examples of the release agent include a silicone-based resin, an olefin-based resin, an isoprene-based resin, a rubber-based elastomer such as a butadiene-based resin and the like, a long-chain alkyl based resin, an alkyd-based resin, a fluorine-based resin, and the like.

A thickness of the release sheet is not particularly limited; and it is preferably 10 to 200 μm, and more preferably 20 to 150 μm.

[Method for Producing Adhesive Tape]

A method for producing the adhesive tape of the present invention is not particularly limited, and can be produced by a known method.

For example, the following is a method for producing the adhesive tape having the base, the buffer layer provided on one surface of the base, and the adhesive layer provided on the other surface of the base.

When the buffer layer is formed by the buffer layer forming composition that includes the energy ray polymerizable compound, the buffer layer provided by coating and curing the buffer layer forming composition on a release sheet is adhered to the base, and the release sheet is then removed, thereby a laminate of the buffer layer and the base is obtained. Also, when the buffer layer is a layer including a polyolefin resin film, the laminate of the buffer layer and the base is obtained by adhering the buffer layer and the base.

Then, the adhesive layer provided on the release sheet is adhered to the laminate on the base side, and thereby the adhesive tape in which the release sheet is adhered to the surface of the adhesive layer can be produced. The release sheet adhered to the surface of the adhesive layer may be appropriately released and removed before using the adhesive tape.

As a method for forming the buffer layer on the release sheet, the buffer layer may be formed by directly applying the buffer layer forming composition on the release sheet by a known coating method to form a coating film, and then energy ray is irradiated to the coating film. Alternatively, the buffer layer may be formed by directly applying the buffer layer forming composition to one surface of the base and the coating film may be heat-dried or energy ray may be irradiated.

Examples of the coating method of the buffer layer forming composition include a spin coating method, a spray coating method, a bar coating method, a knife coating method, a roll coating method, a blade coating method, a die coating method, a gravure coating method, and the like. Also, in order to improve the coating property, the buffer layer forming composition may be combined with an organic solvent, and may be coated on the release sheet in a solution form.

When the buffer layer forming composition includes an energy ray polymerizable compound, preferably the coating film of the buffer layer forming composition is cured by irradiating energy ray, and thereby the buffer layer is formed. The buffer layer may be cured by one curing treatment or curing may be performed in a plurality of individual times. For example, after the buffer layer is formed by completely curing the coating film on the release sheet, the buffer layer thus obtained may be adhered to the base; and alternatively, a buffer layer forming film in a semi-cured state may be formed without completely curing the coating film, and the buffer layer forming film may be adhered to the base and the buffer layer may be then completely cured by energy ray irradiation. Thereby, the buffer layer may be formed. Ultraviolet rays are preferable as energy ray irradiation for the curing treatment. Note that, the coating film of the buffer layer forming composition may be exposed at the time of curing, and preferably the coating film may be covered with the release sheet or the base and curing is preferably performed by energy ray irradiation while the coating film is unexposed.

When the buffer layer is a layer including a polyolefin resin film, the buffer layer may be adhered to the base by extrusion lamination. Specifically, the polyolefin resin constituting the buffer layer is melted and kneaded by using a T-die film machine and the like, and the melted polyolefin resin is extrusion laminated on one surface of the base while moving the base at a constant speed. The buffer layer may be directly laminated on the base by heat sealing and the like. Further, the buffer layer may be laminated with an easy-adhesion layer in between by a method such as dry lamination and the like.

As a method for forming the adhesive layer on the release sheet, the adhesive layer can be formed by directly coating the adhesive agent (adhesive composition) on the release sheet by a known coating method and then heat-drying the coating film.

The adhesive layer may be formed by directly coating the adhesive agent (adhesive composition) to one surface of the base. Examples of the method for applying the adhesive agent include a spray coating method, a bar coating method, a knife coating method, a roll coating method, a blade coating method, a die coating method, a gravure coating method, and the like which are also shown in the method for producing the buffer layer.

Note that, a method for producing the adhesive tape provided with buffer layers on both surfaces of the base may be performed by, for example, obtaining a laminate in which the buffer layer, the base, and the buffer layer are laminated in this order, and then the adhesive layer may be formed on one of the buffer layers.

[Method for Producing Semiconductor Device]

Preferably, the adhesive tape according to the present invention is adhered to the surface of the semiconductor wafer and it is used when backside grinding of the wafer is performed. More preferably, the adhesive tape according to the present invention is used when performing DBG in which backside grinding of the wafer and dicing of the wafer are performed simultaneously. Particularly preferably, the adhesive tape according to the present invention is used in LDBG in which a group of chips each having a small kerf width is obtained when a semiconductor wafer is diced. The term "a group of chips" refers to a plurality of semiconductor chips having a wafer shape held on the adhesive tape according to the present invention.

As a non-limiting example regarding the use of the adhesive tape, a method for producing a semiconductor device will now be described in detail.

Specifically, the method for producing the semiconductor device includes at least steps 1 to 4 shown below.

Step 1: adhering the above-mentioned adhesive tape to a front surface of the semiconductor wafer, and then cutting the adhesive tape along the outer circumference of the semiconductor wafer.

Step 2: forming a groove from the front surface of the semiconductor wafer or forming a modified region inside the semiconductor wafer from the front surface or a back surface of the semiconductor wafer.

Step 3: dicing the semiconductor wafer, of which the adhesive tape is adhered to the front surface and the above-mentioned groove or the modified region is formed, using the groove or the modified region as a starting point for forming a plurality of chips by grinding the semiconductor wafer from the back surface.

Step 4: releasing the adhesive tape from the diced semiconductor wafer (that is, the plurality of chips).

Each step of the above-mentioned method for producing the semiconductor device will now be described in detail.

(Step 1)

In Step 1, the adhesive tape according to the present invention is adhered to the front surface of the semiconductor wafer via the adhesive layer, then the adhesive tape is cut along the outer circumference of the semiconductor wafer. The adhesive tape is adhered so that it covers the semiconductor wafer and also outer table which extends around the semiconductor wafer. Then, the adhesive tape is cut along the outer circumference of the semiconductor wafer using a cutter and the like. A cutting speed is usually 10 to 300 mm/s. A temperature of a cutter blade may be room temperature, or the cutter blade may be heated and then cut.

This step may be performed before Step 2, which will be described later, or may be performed after Step 2. For example, in case of forming the modified region in the semiconductor wafer, Step 1 is preferably performed before Step 2. On the other hand, in case of forming the groove to the front surface of the semiconductor wafer by dicing and the like, Step 1 is performed after Step 2. That is, the adhesive tape is adhered in this Step 1 to the front surface of the wafer having the groove formed in Step 2, which will be described later.

The semiconductor wafer used in the present producing method may be a silicon wafer; a wafer of gallium arsenide, silicon carbide, lithium tantalate, lithium niobate, gallium nitride, indium phosphide, and the like; or a glass wafer. The thickness of the semiconductor wafer before grinding is not particularly limited, and usually it is about 500 to 1000 µm. Also, the semiconductor wafer usually has circuits formed on a surface thereof. The circuits are formed to the wafer surface by various methods including generally used conventional methods such as an etching method, a lift-off method, and the like.

(Step 2)

In Step 2, the groove is formed from the front surface of the semiconductor wafer, or the modified region is formed inside the semiconductor wafer from the front surface or the back surface of the semiconductor wafer.

The groove formed in this step is a groove having a depth shallower than the thickness of the semiconductor wafer. The groove can be formed by dicing using a conventionally known wafer dicing apparatus and the like. In Step 3 which is described later, the semiconductor wafer is divided along the groove into a plurality of semiconductor chips.

Also, the modified region is a brittle portion; and during the grinding step, the semiconductor wafer becomes thinner, or the semiconductor wafer is broken as force is applied during grinding, then the brittle portion function as a starting point to dice into the semiconductor chips. That is, the groove and the modified region formed during Step 2 are formed along a dividing line which is used to divide the semiconductor wafer into semiconductor chips in Step 3 that will be described later.

The modified region is formed by laser irradiation which is focused to the inside of the semiconductor wafer, thereby the modified region is formed to the inside of the semiconductor wafer. The laser irradiation may be performed from the front surface side or the back surface side of the semiconductor wafer. Note that, when the modified region is formed, if Step 2 is performed after Step 1 and laser irradiation is performed from the front surface of the wafer, the semiconductor wafer is to be irradiated with laser beam through the adhesive tape.

The semiconductor wafer adhered with the adhesive tape and formed with the modified region or the groove is placed on a chuck table, and the semiconductor wafer is sucked and held by the chuck table. At this time, the front surface side of the semiconductor wafer is placed on a side of the table and the semiconductor wafer is suctioned.

(Step 3)

After Step 1 and Step 2, the back surface of the semiconductor wafer on the chuck table is ground to dice the semiconductor wafer into a plurality of semiconductor chips.

Here, when the groove is formed to the semiconductor wafer, backside grinding is performed by thinning the semiconductor wafer until at least to the bottom of the groove. By this backside grinding, the groove cuts through the wafer, and the semiconductor wafer is divided at this cut and thereby diced into individual semiconductor chips.

On the other hand, when the modified region is formed, the grinding surface (the back surface of the wafer) may reach the modified region by grinding, but may not precisely reach the modified region. That is, the semiconductor wafer may be ground close to the modified region so that the semiconductor wafer is broken from the modified region as a starting point and diced into semiconductor chips. For example, actual dicing of the semiconductor chips may be performed by adhering a pickup tape that will be described later and then stretching the pickup tape.

After backside grinding is completed, dry polishing may be performed prior to picking up the chips.

Each of the diced semiconductor chips may have a square shape or an elongated shape such as a rectangular shape and the like. The thickness of the diced semiconductor chip is not particularly limited, and it is preferably about 5 to 100 µm, and more preferably 10 to 45 µm. According to LDBG in which the modified region is provided on the inside of the wafer by laser, and the wafer is diced by a stress and the like while backside grinding of the wafer, the thickness of the diced semiconductor chips is 50 or less, and more preferably 10 to 45 µm. Also, the size of the diced semiconductor chip is not particularly limited, but is preferably less than 600 mm$^2$, more preferably less than 400 mm$^2$, and even more preferably less than 300 mm$^2$.

When the adhesive tape of the present invention is used, even for such thin and/or compact semiconductor chips, cracks of the semiconductor chips are prevented while backside grinding (Step 3) and while releasing the adhesive tape (Step 4).

(Step 4)

Next, the semiconductor processing adhesive tape is released from the diced semiconductor wafer (that is, a plurality of semiconductor chips). This step is performed, for example, by the following method.

First, when the adhesive layer of the adhesive tape is formed by an energy ray curable adhesive agent, the adhesive layer is cured by energy ray irradiation. Next, a pickup tape is adhered to the back surface side of the diced semiconductor wafer, and position and direction are aligned so that the chips can be picked up. At this time, a ring frame placed on the outer peripheral side of the wafer is also adhered to the pickup tape, and the outer peripheral edge portion of the pickup tape is fixed to the ring frame. The pickup tape may be adhered to the wafer and the ring frame at the same time, or may be adhered at different timings. The adhesive tape is then released from the plurality of semiconductor chips held by the pickup tape.

Then, a plurality of semiconductor chips on the pickup tape are picked up and fixed on a substrate and the like to produce a semiconductor device.

The pickup tape is not particularly limited, and is formed by, for example, an adhesive tape including a base and an adhesive layer provided on at least one surface of the base.

Also, a bonding tape may be used instead of the pickup tape. Examples of the bonding tape include a laminate of a film-shaped bonding agent and a release sheet; a laminate of a dicing tape and a film-shaped bonding agent; a dicing die-bonding tape made of a release sheet and a bonding layer which function as both a dicing tape and a die-bonding tape. Also, before adhering the pickup tape, the film-shaped bonding agent may be adhered to the back surface side of the diced semiconductor wafer. When the film-shaped bonding agent is used, the film-shaped bonding agent may have a shape identical to the shape of the wafer.

When the bonding tape is used or the film-shaped bonding agent is adhered to the back surface side of the semiconductor wafer which is diced before the pickup tape is adhered, the plurality of semiconductor chips on the bonding tape or the pickup tape are picked up together with the bonding layer divided into shapes identical to the shapes of the semiconductor chips. The semiconductor chips are then fixed on a substrate and the like with the bonding layer in between, thereby the semiconductor device is produced. The bonding layer is diced by laser or by expansion.

Hereinabove, the adhesive tape according to the present invention is described using the method of dicing the semiconductor wafer by DBG or LDBG as examples, and the adhesive tape according to the present invention can be preferably used in LDBG in which a group of chips having even thinner thickness and has a small kerf width is obtained after dicing the semiconductor wafer. Note that, the adhesive tape according to the present invention can also be used for usual backside grinding, and can also be used to temporarily holding a workpiece while processing glass, ceramic, and the like. Also, the adhesive tape according to the present invention can also be used as various types of re-releasable adhesive tapes.

Second Embodiment

Figure 2:
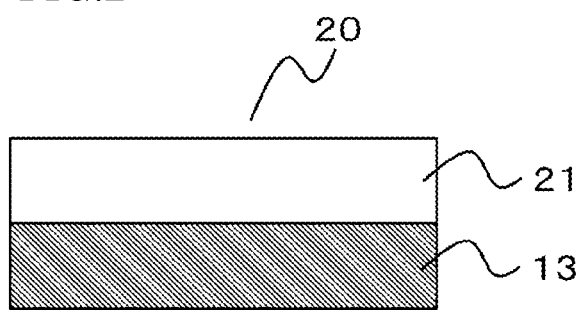
FIG. 2 is a schematic diagram of an adhesive sheet of the second embodiment according to the present invention.

As shown in FIG. 2, in the second embodiment of the present invention, the adhesive tape 20 refers to a laminate including a base 21 and an adhesive layer 13 provided on at least one surface of the base. Note that, the adhesive tape may also include constituent layers other than these constituent layers. For example, a primer layer may be formed on the surface of the base on the adhesive layer side, and a release sheet for protecting the adhesive layer until it is used may be laminated on the surface of the adhesive layer. Also, the base may be a single layer or a multilayer. The same applies to the adhesive layer.

Hereinafter, the constituents of each member of the semiconductor processing adhesive tape according to the second embodiment is described in further detail.

[Base]

A breaking energy at 23° C. of the base is 13 to 80 MJ/m$^3$. The adhesive tape is adhered to the semiconductor wafer around normal temperature (23° C.) and it is cut along the outer circumference of the wafer. When the breaking energy at normal temperature (23° C.) of the base is 13 to 80 MJ/m$^3$, the base does not deform when the cutter blade contacts with the base while cutting, or the base may deform instantaneously and returns to its original form instantaneously. Thus, warpage and tearing of the base are suppressed while cutting, and the tape debris can be also suppressed. On the other hand, if the breaking energy at 23° C. of the base is less than 13 MJ/m$^3$, the base is deformed when the cutter blade contacts the wafer while cutting and does not regain the original form, thus warpage and tearing of the base may occur and the tape debris may be generated. Also, if the breaking energy at 23° C. of the base is larger than 80 MJ/m$^3$, the base may not be able to cut by a cutter, or the cutter blade may abrade.

Note that, even when the cutter blade is heated and then used for cutting, as long as the breaking energy at 23° C. of the base is 13 to 80 MJ/m$^3$, warpage and tearing of the base are suppressed while cutting, and the tape debris can be also reduced.

From the above point of view, the breaking energy at 23° C. of the base is preferably 13 to 60 MJ/m$^3$, more preferably 23 to 58 MJ/m$^3$, and even more preferably 25 to 56 MJ/m$^3$.

The breaking energy is a value obtained by integrating to a breaking point in a stress-strain curve which is a curve of stress and strain obtained from a tensile test at 23° C. based on JIS K7161:1994 and JIS K7127:1999. The strain (mm) can be obtained from "initial length of test pieces (mm)× elongation (%)". Note that, a breaking stress and a breaking elongation which are described in below are respectively stress and elongation at the time of breaking during the tensile test.

From the point of obtaining the breaking energy of the above-mentioned range, the breaking stress at 23° C. of the base is preferably 15 to 300 MPa, more preferably 20 to 250 MPa, and even more preferably 22 to 200 MPa.

The breaking stress can be measured based on JIS K7161:1994 and JIS K7127:1999.

Also, from the point of obtaining the breaking energy of the above-mentioned range, the breaking elongation at 23° C. of the buffer layer is preferably 50 to 400%, more preferably 70 to 350%, and even more preferably 100 to 300%.

The breaking elongation can be measured based on JIS K7161:1994 and JIS K7127:1999.

The base preferably has a Young's modulus of 1000 MPa or more at 23° C. If a base having a Young's modulus of less than 1000 MPa is used, a retaining capability of the semiconductor processing adhesive tape is lowered with respect to a semiconductor wafer or semiconductor chips, and it is therefore impossible to suppress vibrations and the like when backside grinding is performed and chipping or breakage of semiconductor chips are likely to occur. On the other hand, as the base has a Young's modulus of 1000 MPa or more at 23° C., the retaining capability of the adhesive tape is increased with respect to the semiconductor wafer or semiconductor chips, and it is thereby possible to suppress vibrations and the like when backside grinding is performed, and prevents chipping or breakage of the semiconductor chips. Also, it is possible to reduce a stress applied when the adhesive tape is released from semiconductor chips and prevents chipping or breakage of the chips while releasing the adhesive tape. Further, a workability can also be improved while adhering the adhesive tape to the semiconductor wafer. From such point of view, the Young's modulus of the base at 23° C. is preferably 1800 to 30000 MPa, and more preferably 2500 to 6000 MPa.

A thickness of the base is not particularly limited, and preferably it is 110 μm or less, more preferably 15 to 110 μm, and even more preferably 20 to 105 μm. By setting the thickness of the base to be 110 μm or less, a releasing force of the adhesive tape can be controlled easily. By setting the thickness to 15 μm or more, the base can easily function as a support of the adhesive tape.

A material of the base is not particularly limited as long as the base satisfies the above-mentioned physical properties, and various resin films can be used. Here, as the base having a Young's modulus of 1000 MPa or more at 23° C., for example, resin films such as polyethylene terephthalate, polyethylene naphthalate, polybutylene terephthalate, polyesters such as wholly aromatic polyester and the like, polyimide, polyamide, polycarbonate, polyacetal, modified-polyphenyleneoxide, polyphenylene sulfide, polysulfone, polyether ketone, biaxially oriented polypropylene, and the like may be mentioned.

Among these resin films, a film containing at least one selected from a polyester film, a polyamide film, a polyimide film, and a biaxially oriented polypropylene film is preferable; a film containing a polyester film is more preferable; and a film containing a polyethylene terephthalate film is even more preferable.

In the second embodiment, as long as the breaking energy is within the above-mentioned range, the base having Young's modulus at 23° C. of less than 1000 MPa may be used. For example, by forming the base with a layer including polyolefin resin film, the breaking energy of the base can be easily within the above-mentioned range.

The polyolefin resin is not particularly limited, and examples thereof include polyethylene resins such as very low density polyethylene (VLDPE, density: 880 kg/m$^3$ or more and less than 910 kg/m$^3$), low density polyethylene (LDPE, density: 910 kg/m$^3$ or more and less than 930 kg/m$^3$), medium density polyethylene (MDPE, density: 930 kg/m$^3$ or more and less than 942 kg/m$^3$), high density polyethylene (HDPE, density: 942 kg/m$^3$ or more) and the like; a polypropylene resin; a polyethylene-polypropylene copolymer; an olefin-based elastomer (TPO); a cycloolefin resin; an ethylene-vinyl acetate copolymer (EVA); an ethylene-vinyl acetate maleic anhydride copolymer; an ethylene-(meth)acrylic acid copolymer; an ethylene-(meth) acrylic acid ester copolymer; an ethylene-(meth)acrylic acid ester-maleic anhydride copolymer; and the like.

These polyolefin resins may be used alone, or two or more thereof may be combined for use.

Among the above-mentioned polyolefin resins, a polyethylene resin is preferable, and a low-density polyethylene is more preferable in view of obtaining the base having specific physical properties.

The base may contain a plasticizer, a lubricant, an infrared absorber, an ultraviolet absorber, a filler, a colorant, an antistatic agent, an antioxidant, a catalyst, and the like as long as the effects of the present invention are not impaired. Also, the base may be transparent or opaque, and may be colored or vapor-deposited as desired.

At least one surface of the base may be subjected to an adhesion treatment such as a corona treatment in order to improve adhesion with the adhesive layer. The base may include the above-mentioned resin film and an easy-adhesion layer with which at least one surface of the resin film is coated.

An easy-adhesion layer forming composition which is used to form the easy-adhesion layer is not particularly limited, and for example, a composition containing a polyester-based resin, a urethane-based resin, a polyester-urethane-based resin, an acrylic-based resin and the like may be mentioned. The easy-adhesion layer forming composition may contain a crosslinking agent, a photopolymerization initiator, an antioxidant, a softener (plasticizer), a filler, a rust inhibitor, a pigment, a dye, and the like, if needed.

The easy-adhesion layer has a thickness of preferably 0.01 to 10 μm and more preferably 0.03 to 5 μm. Note that, since the easy-adhesion layer of examples of the present application is thin with respect to the thickness of the base, the thickness of the resin film having the easy-adhesion layer and the thickness of the base are substantially the same. Also, since the material of the easy-adhesion layer is soft, the breaking energy is barely affected, and thus the breaking energy of the base is substantially the same as the breaking energy of the resin film even when the base includes the easy-adhesion layer.

For example, the breaking energy of the base can be controlled by choice of the resin composition, addition of a plasticizer, conditions of stretching while producing the resin film. Specifically, when a polyethylene terephthalate film is used as the base, the breaking energy of the base tends to decrease if the content ratio of the ethylene component in the copolymerization component increases. The breaking energy of the base tends to decrease if the amount of the plasticizer is large relative to the amount of the resin composition constituting the base.

A method for producing the adhesive layer, the release sheet, and the semiconductor device of the second embodiment may be the same as the first embodiment.

Also, a method for producing the adhesive tape may be the same as the first embodiment except for not providing the buffer layer.

EXAMPLES

Hereinbelow, the present invention is described in further detail based on Examples, however the present invention is not limited thereto.

A measurement method and an evaluation method are as described below. Note that, the outer most layer shown in Table 1 refers to a base when an adhesive sheet is made of a base and an adhesive layer; and when the adhesive tape is made of a base, a buffer layer, and an adhesive layer, the outer most layer refers to the buffer layer.

[Breaking Energy, Young's Modulus, Breaking Elongation, Breaking Stress]

The breaking energy, the Young's modulus, the breaking elongation, and the breaking stress of the base and the buffer layer were measured using an universal testing machine (product name: "Autograph AG-IS" made by Shimadzu Corporation). Specifically, a measurement sample having a size of width 1.5 mm×length 150 mm×thickness 0.2 mm was prepared from the base used in Examples 5 and 6, or a cured product of a buffer layer forming composition used in Examples 1 to 4 and Comparative examples 1 and 2. The measurements were carried out to the measurement sample under the conditions of a chuck space 100 mm (both ends of 25 mm in a longitudinal direction of the measurement sample were fixed to the machine), a tensile speed of 200 mm/sec, 23° C., and 50% RH.

[Evaluation of Tape Debris]

A semiconductor processing adhesive tape produced in Examples 1 to 6 and Comparative examples 1 and 2 was adhered to a silicon wafer having a diameter of 12 inch and a thickness of 775 μm using a back grinding tape laminator (product name: "RAD-3510F/12" made by Lintec Corporation) and then the semiconductor processing adhesive tape was cut along an outer circumference of the silicon wafer. A cross section of the adhesive tape being cut was observed by a scanning electron microscope (SEM), and was evaluated based on below standards.

1: Cross section of sheet was rough and had tearing in many places.
2: Cross section of sheet was rough and tearing was observed.
3: Cross section of sheet was slightly rough and some tearing was observed.
4: Cross section of sheet was slightly rough but had no tearing.
5: No roughness was observed at the cross section and no tearing was observed.

Note that, all parts by mass of the following Examples and Comparative Example are expressed in terms of solid content.

Example 1

(1) Base

As the base, a PET film with an easy-adhesion layer on both sides (Cosmoshine A4300 manufactured by Toyobo Co., Ltd., thickness: 50 μm, Young's modulus at 23° C.: 2550 MPa) was prepared.

(2) Buffer Layer
(Synthesis of Urethane Acrylate Based Oligomer)

A terminal isocyanate urethane prepolymer obtained by a reaction between polycarbonate diol and isophorone diisocyanate was reacted with 2-hydroxyethyl acrylate to obtain a urethane acrylate based oligomer (UA-1) having a weight average molecular weight (Mw) of approximately 25000.

(Preparation of Buffer Layer Forming Composition)

20 parts by mass of the above synthesized urethane acrylate based oligomer (UA-1), 70 parts by mass of isobornyl acrylate (IBXA), 10 parts by mass of phenylhydroxypropylacrylate (HPPA) were combined, and 2.0 parts by mass of 2-hydroxy-2-methyl-1-phenyl-propan-1-one (product name: "Irgacure1173" manufactured by BASF Japan Ltd.) as a photopolymerization initiator was further combined, thereby the buffer layer forming composition was prepared.

(3) Adhesive Layer
(Preparation of Adhesive Composition)

An acrylic-based polymer (b) was obtained by copolymerizing 52 parts by mass of n-butyl acrylate (BA), 20 parts by mass of methyl methacrylate (MMA), and 28 parts by mass of 2-hydroxyethyl acrylate (2HEA). This acrylic based polymer (b) was reacted with 2-methacryloyloxyethyl isocyanate (MOI) so as to be added to 90 mol % of hydroxyl groups of all of the hydroxyl groups of the acrylic-based polymer (b), and thereby an energy ray curable acrylic based resin (Mw: 500000) was obtained.

To 100 parts by mass of this energy ray curable acrylic-based resin, 6 parts by mass of polyfunctional urethane acrylate as an energy ray curable compound, 1 part by mass of an isocyanate-based crosslinking agent (product name: "Coronate L" manufactured by Tosoh Corporation), and 1 part by mass of bis (2, 4, 6-trimethylbenzoyl) phenylphosphine oxide as a photopolymerization initiator were combined, and diluted with methyl ethyl ketone, thereby a coating liquid of the adhesive composition having a solid content concentration of 32 mass % was prepared.

(4) Production of Adhesive Tape

The coating liquid of the adhesive composition obtained in above was applied to a release treatment surface of a release sheet (product name: "SP-PET381031" manufactured by Lintec Corporation) and heat-dried, thereby the adhesive layer having a thickness of 30 μm on the release sheet was formed.

The buffer layer forming composition was applied to a release treatment surface of another release sheet (product name: "SP-PET381031" manufactured by Lintec Corporation) to form a coating film. Next, ultraviolet ray was irradiated to the coating film to semi-cure the coating film, thereby the buffer layer forming film having a thickness of 53 μm was formed.

Note that, the above-mentioned ultraviolet irradiation was performed by using a belt conveyor type ultraviolet irradiation apparatus (apparatus name: "US2-0801" manufactured by EYE GRAPHICS Co., Ltd.) and a high-pressure mercury lamp (apparatus name: "H08-L41" manufactured by EYE GRAPHICS Co., Ltd.) under an irradiation condition in which a lamp height was 230 mm, an output was 80 mW/cm, an illuminance was 90 mW/cm$^2$ at a wavelength of 365 nm, and an irradiation dose was 50 mJ/cm$^2$.

The surface of the buffer layer forming film was adhered to the base, and ultraviolet ray was irradiated again from the release sheet side on the buffer layer forming film, and the buffer layer forming film was thereby completely cured and formed the buffer layer having a thickness of 53 μm. Note that, the above-mentioned ultraviolet irradiation was performed by using the above-mentioned ultraviolet irradiation apparatus and the high-pressure mercury lamp under an irradiation condition of a lamp height of 220 mm, a conversion output of 120 mW/cm, an illuminance of 160 mW/cm$^2$ at a wavelength of 365 nm, and an irradiation dose of 650 mJ/cm$^2$.

The adhesive layer was then adhered to a surface of the base opposite to the surface on which the buffer layer was formed, thereby the semiconductor processing adhesive tape was made.

Example 2

The adhesive tape was obtained as similar to Example 1 except that for the synthesis of urethane acrylate based oligomer of the buffer layer, urethane acrylate based oligomer having a weight average molecular weight of about 20000 (UA-2) was obtained; and for preparing the buffer layer forming composition, 35 parts by mass of the urethane acrylate based oligomer (UA-2), 40 parts by mass of isobornyl acrylate (IBXA), and 25 parts by mass of phenylhydroxypropyl acrylate (HPPA) were used.

Example 3

The adhesive tape was obtained as same as Example 2 except that for preparing the buffer layer forming composition, 25 parts by mass of urethane acrylate based oligomer (UA-2) and 50 parts y mass of isobornyl acrylate (IBXA) were used.

Example 4

The adhesive tape was obtained as similar to Example 1 except that for the synthesis of urethane acrylate based oligomer of the buffer layer, urethane acrylate based oligomer (UA-3) having a weight average molecular weight of about 10000 was obtained; and for preparing the buffer layer forming composition, 40 parts by mass of the urethane acrylate based oligomer (UA-3), 40 parts by mass of isobornyl acrylate (IBXA), and 20 parts by mass of phenylhydroxypropyl acrylate (HPPA) were used.

Example 5

The adhesive tape was obtained as same as Example 1 except for changing the base to a low density polyolefin film (thickness: 25 Young's modulus at 23° C.: 380 MPa) and not providing the buffer layer.

Example 6

The adhesive tape was obtained as same as Example 1 other than not providing the buffer layer.

Comparative Example 1

The adhesive tape was obtained as same as Example 1 except that for preparing the buffer layer forming composition, 30 parts by mass of urethane acrylate oligomer (UA-3), 50 parts by mass of isobornyl acrylate (IBXA), and 20 parts by mass of phenylhydroxypropyl acrylate (HPPA) were used.

Comparative Example 2

The adhesive tape was obtained as same as Example 1 except that for preparing the buffer layer forming composition, 30 parts by mass of urethane acrylate oligomer (UA-2), and 20 parts by mass of tetrahydrofurfuryl acrylate (THFA) and 50 parts by mass of 4-acyloylmorpholine (ACMO) were used instead of isoborniyl acylate (IBXA) and phenylhydroxypropyl acrylate (HPPA).

According to above results, it is apparent that by using the semiconductor processing adhesive tape according to the present invention, the tape debris can be reduced. The adhesive sheet which produces many tape debris has a high chance of breaking while cracking proceeds when the semiconductor device is produced. Thus, by using the adhesive tape according to the present invention, an excellent productivity of the semiconductor wafer can be attained.

NUMERICAL REFERENCES

10 . . . Adhesive sheet
11 . . . Base
12 . . . Buffer layer
13 . . . Adhesive layer
20 . . . Adhesive sheet
21 . . . Base

What is claimed is:
1. A semiconductor processing adhesive tape comprising a base, a buffer layer provided at least on one surface of the base, and an adhesive layer provided on another surface of the base, wherein
a breaking energy at 23° C. of the buffer layer is 13 to 80 MJ/m$^3$.
2. The semiconductor processing adhesive tape according to claim 1, wherein a Young's modulus at 23° C. of the base is 1000 to 30,000 MPa.
3. The semiconductor processing adhesive tape according to claim 1, wherein the buffer layer is a cured product of a buffer layer forming composition including an energy ray polymerizable compound.

TABLE 1

| | Basic constitution Base/ Buffer layer | Adhesive layer thickness (μm) | Amount of composition in buffer layer forming composition (parts by mass) | | | | | | | Physical properties of outer most layer | | | | Evaluation of tape debris |
|---|---|---|---|---|---|---|---|---|---|---|---|---|---|---|
| | | | UA-1 (25000) | UA-2 (20000) | UA-3 (10000) | IBXA | HPPA | THFA | ACMO | Young's modulus (MPa) | Breaking stress (MPa) | Breaking elongation (%) | Breaking energy (MJ/m3) | |
| Example 1 | PET50 μm/Buffer layer 53 μm | 30 | 20 | — | — | 70 | 10 | — | — | 243 | 26 | 288 | 34.1 | 5 |
| Example 2 | PET50 μm/Buffer layer 53 μm | 30 | — | 35 | — | 40 | 25 | — | — | 56 | 25 | 274 | 23.5 | 4 |
| Example 3 | PET50 μm/Buffer layer 53 μm | 30 | — | 25 | — | 50 | 25 | — | — | 401 | 23 | 197 | 21.1 | 4 |
| Example 4 | PET50 μm/Buffer layer 53 μm | 30 | — | — | 40 | 40 | 20 | — | — | 449 | 29 | 110 | 17.3 | 4 |
| Example 5 | Polyolefin 25 μm | 30 | — | — | — | — | — | — | — | 380 | 30 | 112 | 27.1 | 5 |
| Example 6 | PET 50 μm | 30 | — | — | — | — | — | — | — | 2550 | 184 | 137 | 55.3 | 5 |
| Comparative example 1 | PET50 μm/Buffer layer 53 μm | 30 | — | — | 30 | 50 | 20 | — | — | 756 | 16 | 35 | 3 | 1 |
| Comparative example 2 | PET50 μm/Buffer layer 53 μm | 30 | — | 30 | — | — | — | 20 | 50 | 198 | 17 | 142 | 12.8 | 3 |

4. The semiconductor processing adhesive tape according to claim 1, wherein a thickness of the adhesive layer is less than 100 μm.

5. A semiconductor processing adhesive tape comprising a base and an adhesive layer provided at least to a surface of the base, wherein a breaking energy at 23° C. of the base is 13 to 80 MJ/m$^3$.

6. A method for producing a semiconductor device including:
   cutting the semiconductor processing adhesive tape according to claim 1 along an outer circumference of a semiconductor wafer which is adhered with the semiconductor processing adhesive tape;
   forming a groove from a front surface side of the semiconductor wafer or forming a modified region inside the semiconductor wafer from the front surface or a back surface of the semiconductor wafer;
   dicing the semiconductor wafer, of which the adhesive tape is adhered on the front surface and the groove or the modified region is formed, using the groove or the modified region as a starting point for forming a plurality of chips by grinding from the back surface; and
   releasing the semiconductor processing adhesive tape from the plurality of chips.

* * * * *